United States Patent
Okumura

(10) Patent No.: US 10,741,714 B2
(45) Date of Patent: Aug. 11, 2020

(54) INFRARED DETECTION DEVICE, INFRARED DETECTION APPARATUS, AND MANUFACTURING METHOD OF INFRARED DETECTION DEVICE

(71) Applicant: FUJITSU LIMITED, Kawasaki-shi, Kanagawa (JP)

(72) Inventor: Shigekazu Okumura, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/439,769

(22) Filed: Jun. 13, 2019

(65) Prior Publication Data
US 2020/0013914 A1 Jan. 9, 2020

(30) Foreign Application Priority Data
Jul. 5, 2018 (JP) .................................. 2018-128548

(51) Int. Cl.
*H01L 31/101* (2006.01)
*H01L 31/0224* (2006.01)
*H01L 31/18* (2006.01)

(52) U.S. Cl.
CPC .... *H01L 31/101* (2013.01); *H01L 31/022408* (2013.01); *H01L 31/1844* (2013.01)

(58) Field of Classification Search
CPC ........... H01L 31/101; H01L 31/022408; H01L 31/1844; H01L 31/0352; H01L 31/0224;
(Continued)

(56) References Cited

U.S. PATENT DOCUMENTS 5,479,032 A * 12/1995 Forrest ................ H01L 27/1465
257/184
7,633,083 B2 * 12/2009 Lester ............... H01L 21/02381
257/15
(Continued)

FOREIGN PATENT DOCUMENTS

| JP | 1-94677 | 4/1989 |
| JP | 2008-85265 | 4/2008 |
| JP | 2015-142110 A | 8/2015 |

OTHER PUBLICATIONS

Swaminathan et al. ("Optically-aligned visible/near-infrared dual-band photodetector materials and devices on GaAs using metamorphic epitaxy," J. Appl. Phys. 110, 063109, 2011) (Year: 2011).*

(Continued)

*Primary Examiner* — Yasser A Abdelaziez
(74) *Attorney, Agent, or Firm* — Fujitsu Patent Center

(57) ABSTRACT

An infrared detection device includes a semiconductor substrate; a first metamorphic buffer layer that is formed on the semiconductor substrate; a first contact layer that is formed on the first metamorphic buffer layer; a first infrared absorption layer that is formed on the first contact layer; a second contact layer that is formed on the first infrared absorption layer; a second metamorphic buffer layer that is formed on the second contact layer; a third contact layer that is formed on the second metamorphic buffer layer; a second infrared absorption layer that is formed on the third contact layer; a fourth contact layer that is formed on the second infrared absorption layer; a lower electrode that is connected with the first contact layer; an upper electrode that is connected with the fourth contact layer; and an intermediate electrode that is connected with the second contact layer and the third contact layer.

14 Claims, 15 Drawing Sheets

(58) Field of Classification Search
CPC ......... H01L 21/02395; H01L 21/02398; H01L 21/02463; H01L 21/02466; H01L 21/02546; H01L 21/02549; H01L 27/144; H01L 31/1013
See application file for complete search history.

(56) References Cited

U.S. PATENT DOCUMENTS

2014/0225064 A1* 8/2014 Khoshakhlagh ............... H01L 21/02549 257/21
2014/0264705 A1 9/2014 Ozaki

OTHER PUBLICATIONS

Kuech et al. ("Metamorphic and Non-conventional 'Buffer' Layers," 23rd International Conference on Indium Phosphide and Related Materials—IPRM 2011, May 22-26, 2011), (Year: 2011).*

Klipstein et al. ("Modeling InAs/GaSb and InAs/InAsSb Superlattice Infrared Detectors," Journal of Electronic Materials, vol. 43, No. 8, pp. 2984-2990, 2014) (Year: 2014).*

Great Britain Search Report dated Sep. 16, 2019 for corresponding Great Britain Patent Application No. GB1908649.5, 3 pages. Please note JP-2008-85265-A cited herewith, was previously cited in an IDS filed on Jun. 13, 2019.*.

T. Stadelmann et al., "Development of Bi-Spectral InAs/GaSb Type II Superlattice Image Detectors," Proceedings of SPIE, vol. 9070, 2014 (8 pages).

W. L. Sarney et al., "Structural and luminescent properties of bulk InAsSb," Journal of Vacuum Science & Technology B, vol. 30, No. 2, Mar./Apr. 2012 (5 pages).

N. Baril et al., "Bulk $InAs_xSb_{1-x}$ nBn photodetectors with greater than 5 m cutoff on GaSb," Applied Physics Letters 109, 2016 (5 pages).

D. Wang et al., "Infrared emitters and photodetectors with InAsSb bulk active regions," Proceedings of SPIE, vol. 8704, Jun. 11, 2013 (11 pages).

* cited by examiner

INFRARED DETECTION DEVICE, INFRARED DETECTION APPARATUS, AND MANUFACTURING METHOD OF INFRARED DETECTION DEVICE

CROSS-REFERENCE TO RELATED APPLICATION

This application is based upon and claims the benefit of priority of the prior Japanese Patent Application No. 2018-128548, filed on Jul. 5, 2018, the entire contents of which are incorporated herein by reference.

FIELD

The embodiments discussed herein are related to an infrared detection device, an infrared detection apparatus, and a manufacturing method of an infrared detection device.

BACKGROUND

As an infrared detection device that is formed with a semiconductor material and detects infrared rays, for example, there has been an infrared detection device in which infrared absorption layers are formed with an InAs/GaSb superlattice (T2SL) structure on a GaSb substrate. The InAs/GaSb superlattice structure has a type-II band lineup. Thus, adjustment of the film thickness and period of the superlattice enables detection of infrared rays from middle infrared (middle wave (MW)) with wavelengths of 3 to 5 μm to far infrared (long wave (LW)) with wavelengths of 8 to 10 μm.

As an infrared detection device that is capable of detecting two different wavelength bands (for example, middle infrared and far infrared), a two-wavelength type infrared detection device has been disclosed in which infrared absorption layers are formed with a T2SL structure on a GaSb substrate (for example, T. Stadelmann et al., "Development of Bi-Spectral InAs/GaSb Type II Superlattice Image Detectors", Proc. of SPIE, Vol. 9070, 9070V-1, 2014). However, because the minority carrier lifetime in the T2SL structure is shorter than the value that is originally estimated from the materials, the sensitivity of the two-wavelength type infrared detection device with the T2SL structure is lower than the value that is usually estimated.

On the other hand, an infrared detection device in which the infrared absorption layers are formed with InAsSb bulk mixed crystals has been expected for a longer minority carrier lifetime and higher sensitivity at the same film thickness than the infrared detection device with the T2SL structure. Because InAsSb has large band gap bowing, it is possible to detect infrared rays from middle infrared to far infrared by changing Sb composition. A two-wavelength type infrared detection device has been disclosed which uses such an InAsSb bulk mixed crystal for the infrared absorption layer (For example, N. Baril et al., "Bulk InAs$_x$Sb$_{1-x}$ nBn photodetectors with greater than 5 μm cutoff on GaSb", APL, 109, 122104, 2016 and D. Wang et al., "Infrared emitters and photodetectors with InAsSb bulk active regions", Proceedings of SPIE, 8704, 870410-1, 2013). InAsSb does not have a crystal substrate that provides lattice match. Thus, when this two-wavelength type infrared detection device is fabricated, a metamorphic buffer (MB) layer is formed with InAlSb or the like on the GaSb substrate or the like, and crystal growth of InAsSb is thereafter caused.

Japanese Laid-open Patent Publication No. 2008-85265 is an example of related art.

W. L. Sarney et al., "Structural and luminescent properties of bulk InAsSb", JVSTB, 30, 02B105-2, 2012 is also an example of related art.

Incidentally, in the two-wavelength type infrared detection device in which the infrared absorption layers are formed with the bulk mixed crystals, the metamorphic buffer layer is also formed between an infrared absorption layer that detects middle infrared and an infrared absorption layer that detects far infrared. However, the metamorphic buffer layer has many crystal defects. Carriers produced in either one of the infrared absorption layers for middle infrared and far infrared pass through the metamorphic buffer layer formed between those infrared absorption layers, and the detection sensitivity to infrared rays are thus lowered.

Accordingly, as the two-wavelength type infrared detection device in which the infrared absorption layers are formed with the bulk mixed crystals, an infrared detection device is requested which may detect infrared rays in both wavelength bands with proper sensitivity.

An infrared detection device of the present disclosure may obtain proper detection sensitivity to each wavelength band in an infrared detection device in which infrared absorption layers are formed with bulk mixed crystals and which is capable of detecting two or more wavelength bands.

SUMMARY

According to an aspect of the embodiments, an infrared detection device includes a semiconductor crystal substrate; a first metamorphic buffer layer that is formed on the semiconductor crystal substrate; a first contact layer that is formed on the first metamorphic buffer layer; a first infrared absorption layer that is formed on the first contact layer; a second contact layer that is formed on the first infrared absorption layer; a second metamorphic buffer layer that is formed on the second contact layer; a third contact layer that is formed on the second metamorphic buffer layer; a second infrared absorption layer that is formed on the third contact layer; a fourth contact layer that is formed on the second infrared absorption layer; a lower electrode that is connected with the first contact layer; an upper electrode that is connected with the fourth contact layer; and an intermediate electrode that is connected with the second contact layer and the third contact layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
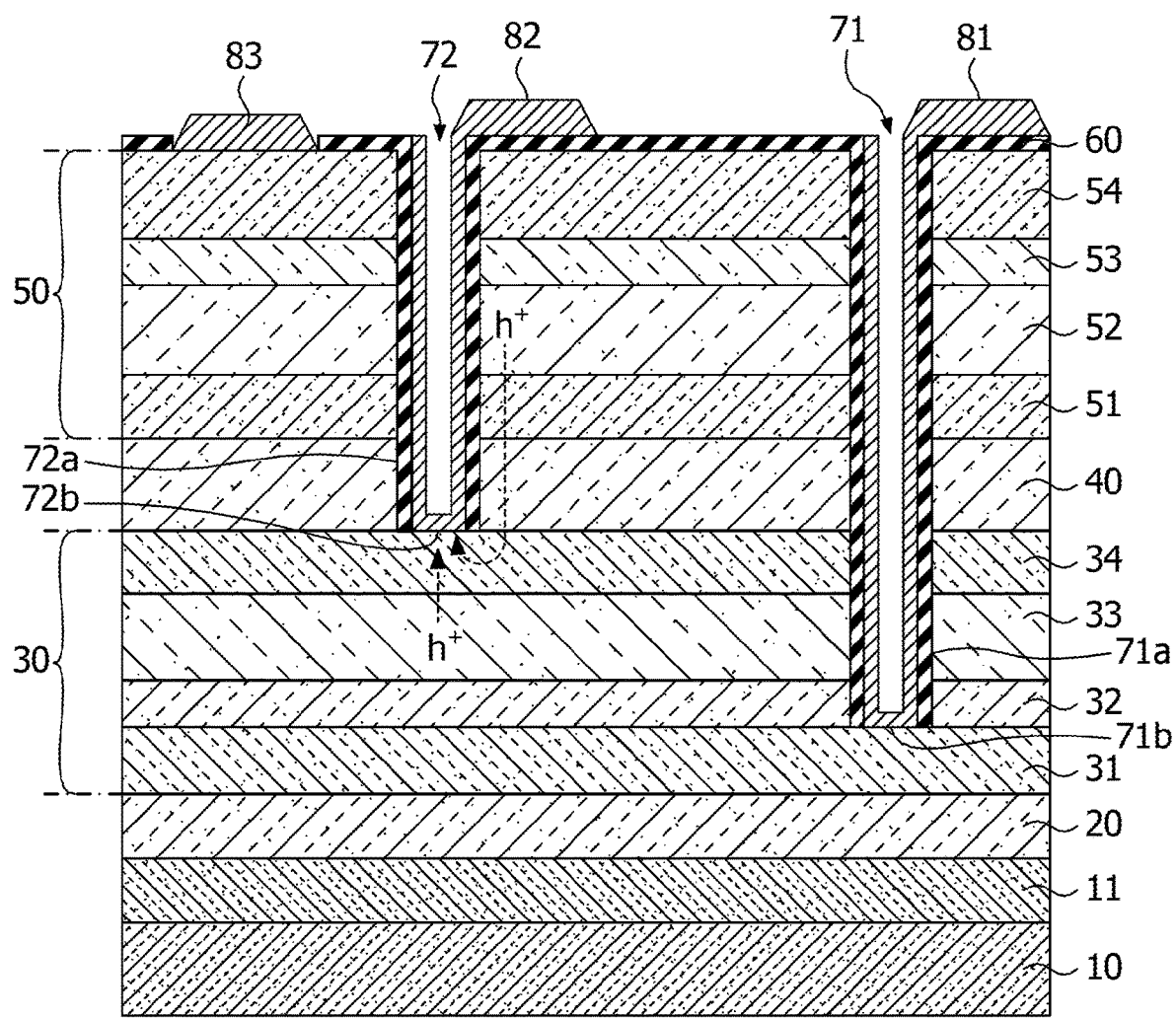
FIG. 1 is a structural diagram of a two-wavelength type infrared detection device.

Embodiments will hereinafter be described. The same members or the like will be provided with the same reference characters, and descriptions thereof will not be made. As for the film thicknesses of layers illustrated in the drawings herein, for convenience, the ratio of the film thicknesses and so forth may be different from the actual ratio.

[First Embodiment]

A description will first be made about a two-wavelength type infrared detection device, in which infrared absorption layers are formed with bulk mixed crystals, based on FIG. 1. In the two-wavelength type infrared detection device illustrated in FIG. 1, a buffer layer 11, a first metamorphic buffer layer 20, a first contact layer 31, a first barrier layer 32, a first infrared absorption layer 33, a second contact layer 34, a second metamorphic buffer layer 40, a third contact layer 51, a second infrared absorption layer 52, a second barrier layer 53, and a fourth contact layer 54 are laminated on a GaSb substrate 10.

In this embodiment, a first infrared absorption unit 30 is formed with the first contact layer 31, the first barrier layer 32, the first infrared absorption layer 33, and the second contact layer 34. A second infrared absorption unit 50 is formed with the third contact layer 51, the second infrared absorption layer 52, the second barrier layer 53, and the fourth contact layer 54. Accordingly, in the two-wavelength type infrared detection device illustrated in FIG. 1, the buffer layer 11, the first metamorphic buffer layer 20, the first infrared absorption unit 30, the second metamorphic buffer layer 40, and the second infrared absorption unit 50 are laminated on the GaSb substrate 10.

The GaSb substrate 10 is a semiconductor crystal substrate of GaSb. The buffer layer 11 is formed with an i-GaSb film, and the first metamorphic buffer layer 20 is formed with i-AlSb with a thickness of approximately 2000 nm. The first contact layer 31 is formed with n-InAs$_{0.8}$Sb$_{0.2}$ with a thickness of approximately 500 nm, and the first barrier layer 32 is formed with i-AlSb with a thickness of approximately 200 nm. The first infrared absorption layer 33 is formed with i-InAs$_{0.8}$Sb$_{0.2}$ with a thickness of approximately 1000 nm, and the second contact layer 34 is formed with n-InAs$_{0.8}$Sb$_{0.2}$ with a thickness of approximately 500 nm. The second metamorphic buffer layer 40 is formed with i-InAlSb with a thickness of approximately 2000 nm. The third contact layer 51 is formed with n-InAs$_{0.54}$Sb$_{0.46}$ with a thickness of approximately 500 nm, and the second infrared absorption layer 52 is formed with i-InAs$_{0.54}$Sb$_{0.46}$ with a thickness of approximately 1000 nm. The second barrier layer 53 is formed with i-In$_{0.25}$Al$_{0.75}$Sb with a thickness of approximately 200 nm, and the fourth contact layer 54 is formed with n-InAs$_{0.54}$Sb$_{0.46}$ with a thickness of approximately 500 nm.

The lattice constant of i-InAs$_{0.8}$Sb$_{0.2}$ that forms the first infrared absorption layer 33 is 6.1424 Å. The lattice constant of i-InAs$_{0.54}$Sb$_{0.46}$ that forms the second infrared absorption layer 52 is 6.2521 Å. Accordingly, the value of (the lattice constant of the second infrared absorption layer—the lattice constant of the first infrared absorption layer)/(the lattice constant of the first infrared absorption layer) is approximately 1.8%.

The fourth contact layer 54, the second barrier layer 53, the second infrared absorption layer 52, the third contact layer 51, the second metamorphic buffer layer 40, the second contact layer 34, the first infrared absorption layer 33, and the first barrier layer 32 are removed, and a first hole 71 is thereby formed. The fourth contact layer 54, the second barrier layer 53, the second infrared absorption layer 52, the third contact layer 51, and the second metamorphic buffer layer 40 are removed, and a second hole 72 is thereby formed.

An insulating film 60 is formed on a side surface 71a of the first hole 71, a side surface 72a of the second hole 72, and the fourth contact layer 54. The insulating film 60 is not formed on a bottom surface 71b of the first hole 71. A lower electrode 81 is formed on the first contact layer 31 of the bottom surface 71b of the first hole 71, on the insulating film 60 of the side surface 71a of the first hole 71, and on the insulating film 60 in the vicinity of the first hole 71. The insulating film 60 is not formed on a bottom surface 72b of the second hole 72. An intermediate electrode 82 is formed on the second contact layer 34 of the bottom surface 72b of the second hole 72, on the insulating film 60 of the side surface 72a of the second hole 72, and on the insulating film 60 in the vicinity of the second hole 72. The insulating film 60 on the fourth contact layer 54 is partially removed, and an upper electrode 83 is formed on the fourth contact layer 54 from which the insulating film 60 is removed.

In the two-wavelength type infrared detection device, when infrared rays are detected, a positive electric potential is applied to the lower electrode 81 and the upper electrode 83, the intermediate electrode 82 is set to a ground potential, and infrared rays incident from the GaSb substrate 10 side are thereby detected. The first infrared absorption layer 33 absorbs infrared rays of middle infrared, and the second infrared absorption layer 52 absorbs infrared rays of far infrared. Thus, the wavelengths of infrared rays that are detected in the first infrared absorption layer 33 and the second infrared absorption layer 52 are different. In the two-wavelength type infrared detection device, the first infrared absorption layer 33 and the second infrared absorption layer 52 are formed not with a multiple quantum structure but with InAsSb bulk mixed crystals.

Infrared rays of a middle infrared wavelength band among the incident infrared rays are absorbed by the first infrared absorption layer 33, and holes as photo carriers are produced. The holes produced in the first infrared absorption layer 33 flow to the intermediate electrode 82 via the second contact layer 34. The holes that flow to the intermediate electrode 82 are measured, and the light amount of the infrared rays of the middle infrared wavelength band, which are absorbed by the first infrared absorption layer 33, may thereby be measured.

Infrared rays of a far infrared wavelength band among the incident infrared rays are transmitted through the first infrared absorption layer 33 with a wide band gap and are absorbed by the second infrared absorption layer 52, and holes as photo carriers are produced. The holes produced in the second infrared absorption layer 52 flow to the intermediate electrode 82 via the third contact layer 51, the second metamorphic buffer layer 40, and the second contact layer 34. Accordingly, the holes that flow to the intermediate electrode 82 are measured, and the light amount of the infrared rays of the far infrared wavelength band, which are absorbed by the second infrared absorption layer 52, may thereby be measured.

Incidentally, the second metamorphic buffer layer 40 is formed between the first infrared absorption layer 33 and the second infrared absorption layer 52. However, the second metamorphic buffer layer 40 includes many crystal defects such as lattice defects. Consequently, the holes that pass through the second metamorphic buffer layer 40 are trapped by the crystal defects in the second metamorphic buffer layer 40, and the amount of holes that reach the intermediate electrode 82 decreases. As described above, when the amount of holes that reach the intermediate electrode 82 decreases, the value of the light amount of the infrared rays of the far infrared wavelength band, which are absorbed by the second infrared absorption layer 52, is detected lower than the actual value, and the light amount of the infrared rays of the far infrared wavelength band may not accurately be measured.

In order to accurately measure the light amount of the infrared rays that are absorbed by the second infrared absorption layer 52, a method is possible in which the second hole 72 is formed such that the bottom surface 72b becomes the third contact layer 51 and an intermediate electrode is formed to contact with the third contact layer 51. However, in this case, because the holes produced in the first infrared absorption layer 33 are trapped by the second metamorphic buffer layer 40 until the holes reach the intermediate electrode, the value of the light amount of the infrared rays absorbed by the first infrared absorption layer 33 is detected lower than the actual value. Thus, the light amount of the infrared rays of the middle infrared wavelength band, which are absorbed by the first infrared absorption layer 33, may not accurately be measured.

Accordingly, a two-wavelength type infrared detection device is requested which may accurately measure the light amount of infrared rays, which are absorbed by each of a first infrared absorption layer and a second infrared absorption layer, even in a case where the first infrared absorption layer and the second infrared absorption layer are formed with bulk mixed crystals. That is, a two-wavelength type infrared detection device is requested which may accurately measure the light amount of infrared rays, which are absorbed by each of the first infrared absorption layer and the second infrared absorption layer, even in a case where a metamorphic buffer layer is formed between the first infrared absorption layer and the second infrared absorption layer, for example.

(Infrared Detection Device)

Figure 2:
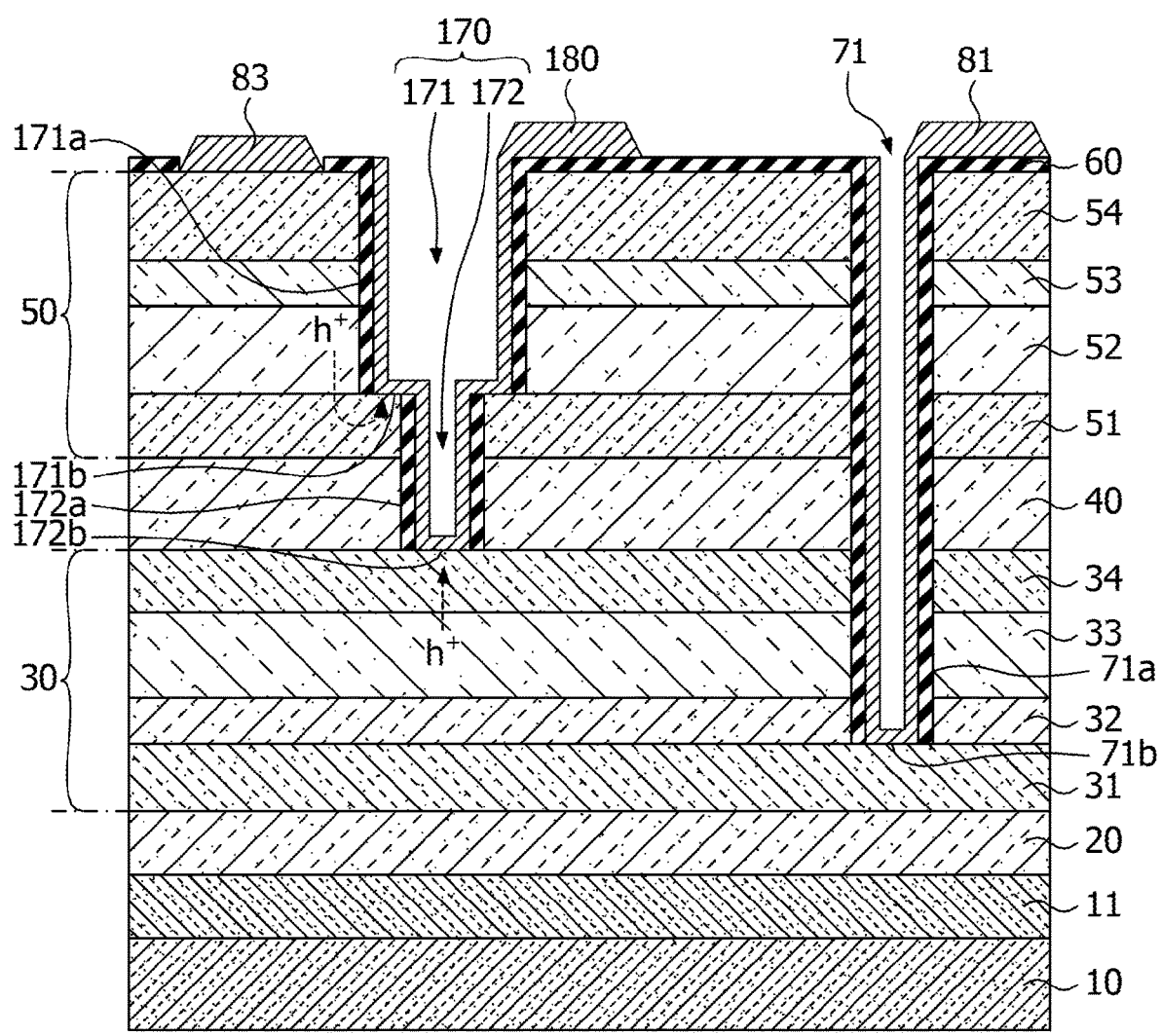
FIG. 2 is a structural diagram of an infrared detection device in a first embodiment.

A description will next be made about an infrared detection device in a first embodiment based on FIG. 2. As illustrated in FIG. 2, the infrared detection device in this embodiment is a two-wavelength type infrared detection device, and a second hole 170 in which an intermediate electrode 180 is formed is formed with a wide width region 171 on an inlet side and a narrow width region 172 with a small diameter in a deeper position than the wide width region 171. In the infrared detection device in this embodiment, the first contact layer 31, the second contact layer 34, the third contact layer 51, and the fourth contact layer 54 are n-type.

The wide width region 171 of the second hole 170 is formed by removing the fourth contact layer 54, the second barrier layer 53, and the second infrared absorption layer 52. The narrow width region 172 is formed by further removing the third contact layer 51 and the second metamorphic buffer layer 40. The diameter of the wide width region 171 of the second hole 170 is ϕ20 μm, and the diameter of the narrow width region 172 is ϕ10 μm. In the second hole 170, a step portion is formed between the wide width region 171 and the narrow width region 172. A side surface 171a of the wide width region 171 and a side surface 172a of the narrow width region 172 are covered by the insulating film 60. The insulating film 60 is not formed on the third contact layer 51 of a bottom surface 171b of the wide width region 171, which becomes the step portion of the second hole 170, and on the second contact layer 34 of a bottom surface 172b of the narrow width region 172.

The intermediate electrode 180 is formed on the insulating film 60 of a side surface of the second hole 170, on the insulating film 60 in the vicinity of the second hole 170, on the third contact layer 51 of the bottom surface 171b of the wide width region 171, and on the second contact layer 34 of the bottom surface 172b of the narrow width region 172. Consequently, in the second hole 170, the third contact layer 51 and the second contact layer 34 are connected together by the intermediate electrode 180.

In the infrared detection device in this embodiment, when infrared rays are detected, a positive electric potential is applied to the lower electrode 81 and the upper electrode 83, the intermediate electrode 180 is set to a ground potential, and infrared rays incident from the GaSb substrate 10 side are thereby detected.

Infrared rays of the middle infrared wavelength band among the incident infrared rays are absorbed by the first infrared absorption layer 33, and holes are produced. The holes produced in the first infrared absorption layer 33 flow to the intermediate electrode 180 via the second contact layer 34. The holes that flow to the intermediate electrode 180 in such a manner are measured, and the light amount of the infrared rays of the middle infrared wavelength band, which are absorbed by the first infrared absorption layer 33, may thereby be measured.

Infrared rays of the far infrared wavelength band among the incident infrared rays are absorbed by the second infrared absorption layer 52, and holes are produced. The holes produced in the second infrared absorption layer 52 flow to the intermediate electrode 180 via the third contact layer 51. The holes that flow to the intermediate electrode 180 in such a manner are measured, and the light amount of the infrared rays of the far infrared wavelength band, which are absorbed by the second infrared absorption layer 52, may thereby be measured.

That is, in the infrared detection device in this embodiment, both of the holes produced in the first infrared absorption layer 33 and the holes produced in the second infrared absorption layer 52 reach the intermediate electrode 180 without passing through the second metamorphic buffer layer 40, for example. That is, both of the holes produced in the first infrared absorption layer 33 and the holes produced in the second infrared absorption layer 52 reach the intermediate electrode 180 without passing through the second metamorphic buffer layer 40 that includes many crystal defects such as lattice defects, for example. Thus, the holes produced in the first infrared absorption layer 33 and the holes produced in the second infrared absorption layer 52 flow to the intermediate electrode 180 without being decreased. Accordingly, the light amount of the infrared rays absorbed by the first infrared absorption layer 33 and the light amount of the infrared rays absorbed by the second infrared absorption layer 52 may accurately be measured without being decreased.

In this embodiment, the first infrared absorption layer 33 and the second infrared absorption layer 52 detect infrared rays at different wavelengths and have different composition ratios and different lattice constants. Thus, the second metamorphic buffer layer 40 is formed between the first infrared absorption layer 33 and the second infrared absorption layer 52.

Based on the findings of the inventor, a metamorphic buffer layer has to be formed in a case where the value of (the lattice constant of the second infrared absorption layer—the lattice constant of the first infrared absorption layer)/(the lattice constant of the first infrared absorption layer) is 0.1% or higher. In a case where the infrared absorption layers are formed with InAsSb mixed crystals, the difference in the lattice constant between the first infrared absorption layer 33 and the second infrared absorption layer 52 becomes greatest in a case where the first infrared absorption layer 33 is InAs and the second infrared absorption layer 52 is InSb. Because the lattice constant of InAs is 6.058 Å and the lattice constant of InSb is 6.480 Å, the value of (the lattice constant of the second infrared absorption layer—the lattice constant of the first infrared absorption layer)/(the lattice constant of the first infrared absorption layer) is 6.97%. Consequently, it is preferable that 0.1% ≤ (the lattice constant of the second infrared absorption layer—the lattice constant of the first infrared absorption layer)/(the lattice constant of the first infrared absorption layer) ≤ 6.97%.

In order to make lattice relaxation to occur by the metamorphic buffer layer, the film thickness of the metamorphic buffer layer is preferably 1000 nm or greater and is further preferably 2000 nm or greater.

The first contact layer 31, the first infrared absorption layer 33, and the second contact layer 34 may be formed of $InAs_XSb_{1-X}$ at the same composition ratio, and X may be set such that $0.8 \leq X \leq 1.0$. The third contact layer 51, the second infrared absorption layer 52, and the fourth contact layer 54 may be formed of $InAs_YSb_{1-Y}$ at the same composition ratio, and Y may be set such that $0 \leq Y < 0.8$.

(Manufacturing Method of Infrared Detection Device)

A description will next be made about a manufacturing method of an infrared detection device in this embodiment based on FIG. 3 to FIG. 13.

Figure 3:
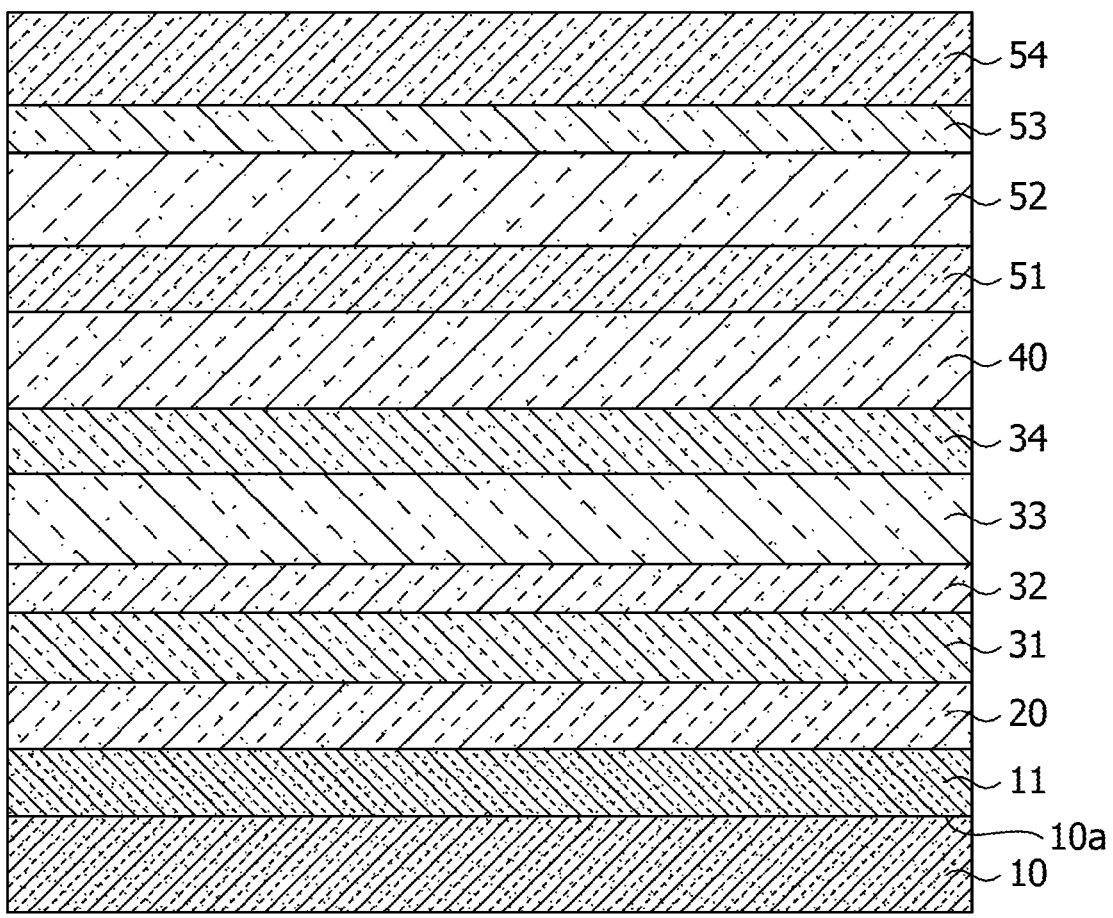
FIG. 3 is a process diagram (1) of a manufacturing method of the infrared detection device in the first embodiment.

As illustrated in FIG. 3, a compound semiconductor film is first laminated and formed on the GaSb substrate 10 by solid-source molecular beam epitaxy (SSMBE). Specifically, the GaSb substrate 10 is placed in a chamber of a solid-source molecular beam epitaxy apparatus, and the GaSb substrate 10 is heated, for example. When the temperature of the GaSb substrate 10 reaches 400° C., the GaSb substrate 10 is further heated while a surface of the GaSb substrate 10 is irradiated with an Sb beam. When the temperature of the GaSb substrate 10 reaches 500° C., an oxide film of the surface of the GaSb substrate 10 starts being dissociated. The surface of the GaSb substrate 10 is irradiated with the Sb beam for 20 minutes with the temperature of the GaSb substrate 10 at 530° C., and the oxide film of the surface of the GaSb substrate 10 is completely detached.

Subsequently, the temperature of the GaSb substrate 10 is set to 520° C. in a state where irradiation is performed with the Sb beam. Irradiation is further performed with a Ga beam, an i-GaSb film with a thickness of approximately 100 nm is formed on a surface 10a of the GaSb substrate 10, and the buffer layer 11 is thereby formed.

Subsequently, irradiation is performed with an Al beam and the Sb beam while the temperature of the GaSb substrate 10 is kept at 520° C., an i-AlSb film with a thickness of approximately 2000 nm is formed, and the first metamorphic buffer layer 20 is thereby formed.

Subsequently, the temperature of the GaSb substrate 10 is set to 450° C., irradiation is performed with an In beam, an As beam, the Sb beam, and an Si beam as a dopant, an $n-InAs_{0.8}Sb_{0.2}$ film with a thickness of approximately 500 nm is formed, and the first contact layer 31 is thereby formed. Here, the concentration of Si as an impurity element with which the first contact layer 31 is doped is $1.0 \times 10^{18}$ $cm^{-3}$, for example.

Subsequently, irradiation is performed with the Al beam and the Sb beam while the temperature of the GaSb substrate 10 is kept at 450° C., an i-AlSb film with a thickness of approximately 200 nm is formed, and the first barrier layer 32 is thereby formed.

Subsequently, irradiation is performed with the In beam, the As beam, and the Sb beam while the temperature of the GaSb substrate 10 is kept at 450° C., an $i-InAs_{0.8}Sb_{0.2}$ film with a thickness of approximately 1000 nm is formed, and the first infrared absorption layer 33 is thereby formed.

Subsequently, irradiation is performed with the In beam, the As beam, the Sb beam, and the Si beam as a dopant while the temperature of the GaSb substrate 10 is kept at 450° C., an $n-InAs_{0.8}Sb_{0.2}$ film with a thickness of approximately 500 nm is formed, and the second contact layer 34 is thereby formed. Here, the concentration of Si as an impurity element with which the second contact layer 34 is doped is $1.0 \times 10^{18}$ $cm^{-3}$, for example.

Subsequently, irradiation is performed with the In beam, the Al beam, and the Sb beam while the temperature of the GaSb substrate 10 is kept at 450° C., an i-InAlSb film with a thickness of approximately 2000 nm is formed, and the second metamorphic buffer layer 40 is thereby formed.

Subsequently, irradiation is performed with the In beam, the As beam, the Sb beam, and the Si beam as a dopant while the temperature of the GaSb substrate 10 is kept at 450° C., an $n-InAs_{0.54}Sb_{0.46}$ film with a thickness of approximately 500 nm is formed, and the third contact layer 51 is thereby formed. Here, the concentration of Si as an impurity element with which the third contact layer 51 is doped is $1.0 \times 10^{18}$ $cm^{-3}$, for example.

Subsequently, irradiation is performed with the In beam, the As beam, and the Sb beam while the temperature of the GaSb substrate 10 is kept at 450° C., an $i-InAs_{0.54}Sb_{0.46}$ film with a thickness of approximately 1000 nm is formed, and the second infrared absorption layer 52 is thereby formed.

Subsequently, irradiation is performed with the In beam, the Al beam, and the Sb beam while the temperature of the GaSb substrate 10 is kept at 450° C., an i-$In_{0.25}Al_{0.75}Sb$ film with a thickness of approximately 200 nm is formed, and the second barrier layer 53 is thereby formed.

Subsequently, irradiation is performed with the In beam, the As beam, the Sb beam, and the Si beam as a dopant while the temperature of the GaSb substrate 10 is kept at 450° C., an n-$InAs_{0.54}Sb_{0.46}$ film with a thickness of approximately 500 nm is formed, and the fourth contact layer 54 is thereby formed. Here, the concentration of Si as an impurity element with which the fourth contact layer 54 is doped is $1.0 \times 10^{18}$ $cm^{-3}$, for example.

Subsequently, the temperature of the GaSb substrate 10 is lowered in a state where irradiation with the Sb beam is maintained, and irradiation with the Sb beam is stopped when the temperature of the GaSb substrate 10 becomes 400° C. When the temperature of the GaSb substrate 10 becomes 100° C. or lower, the GaSb substrate 10 in which the compound semiconductor film laminated by epitaxial growth is formed on the surface 10a is taken out from the inside of the chamber.

Figure 4:
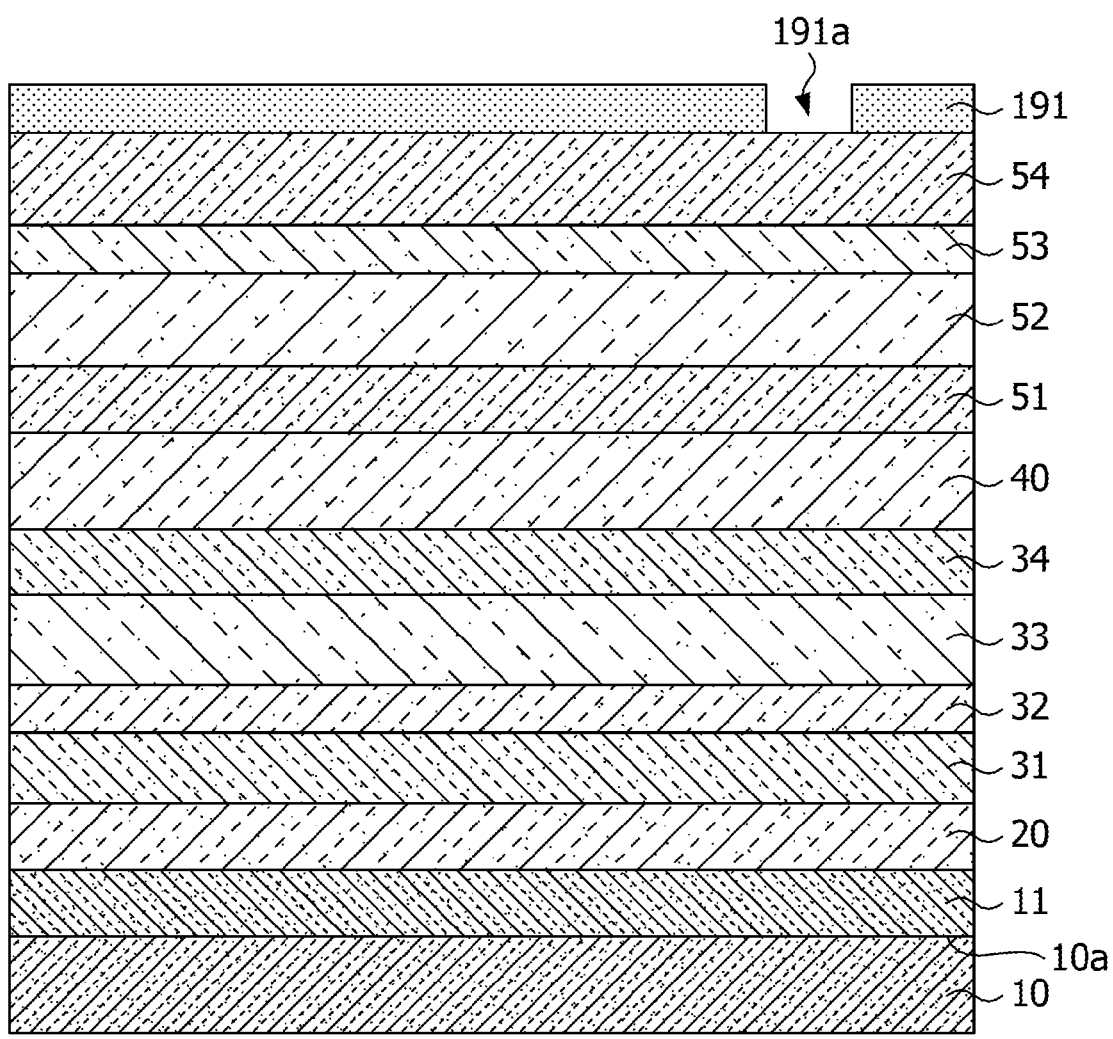
FIG. 4 is a process diagram (2) of the manufacturing method of the infrared detection device in the first embodiment.

As illustrated in FIG. 4, a resist pattern 191 is next formed on the fourth contact layer 54. Specifically, the fourth contact layer 54 is coated with a photoresist, exposure by an exposure apparatus and development are performed, and the resist pattern 191 that has an opening 191a is thereby formed, for example. The thickness of the formed resist pattern 191 is approximately 1 µm, and the diameter of the opening 191a is approximately 10 µm.

Figure 5:
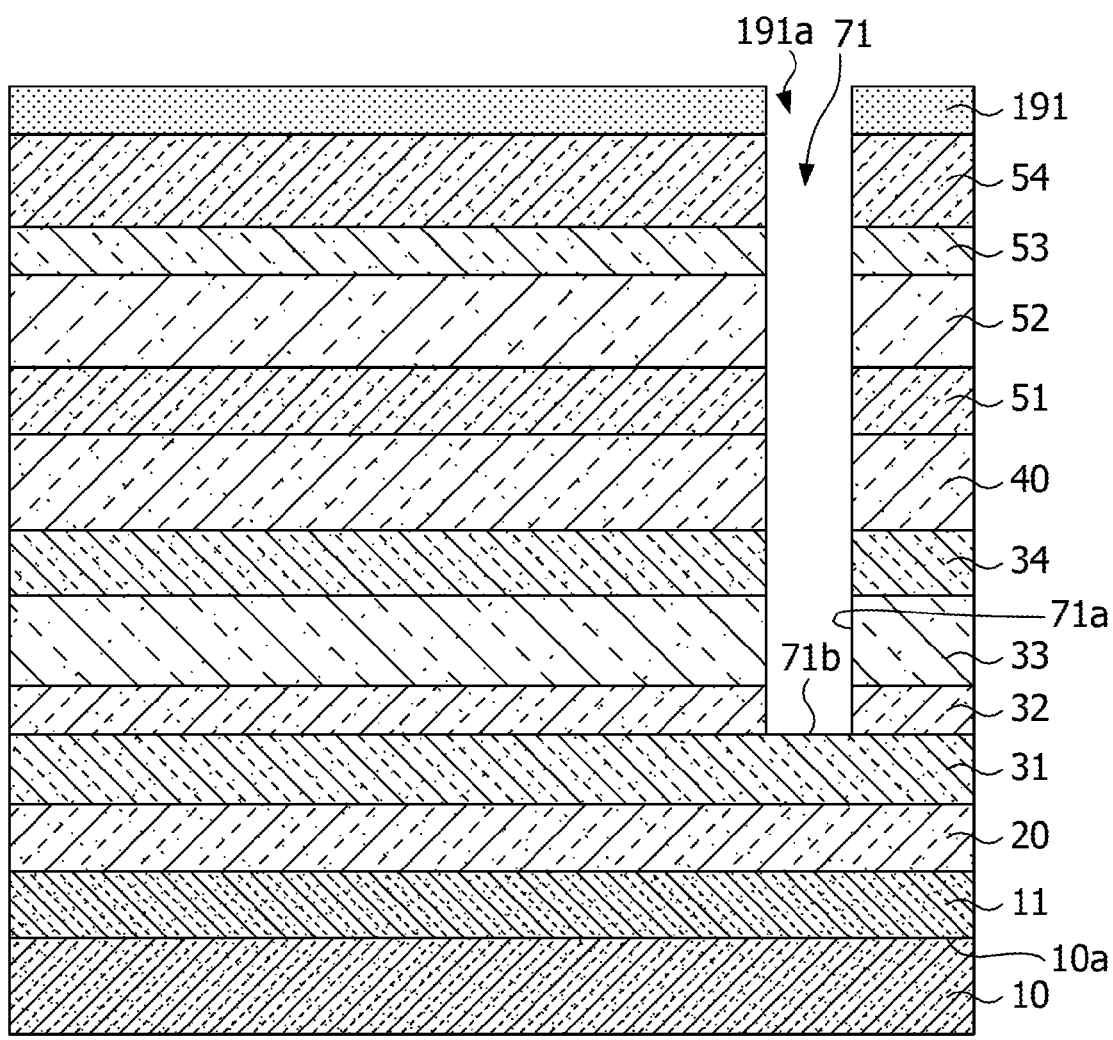
FIG. 5 is a process diagram (3) of the manufacturing method of the infrared detection device in the first embodiment.

As illustrated in FIG. 5, the compound semiconductor film in the opening 191a of the resist pattern 191 is next removed by dry etching such as reactive ion etching (RIE), and the first hole 71 is thereby formed. Specifically, the fourth contact layer 54, the second barrier layer 53, the second infrared absorption layer 52, the third contact layer 51, the second metamorphic buffer layer 40, the second contact layer 34, the first infrared absorption layer 33, and the first barrier layer 32 are removed, and the first hole 71 is thereby formed, for example. The diameter of the first hole 71 formed in such a manner is approximately 10 µm, and the first contact layer 31 is exposed on the bottom surface 71b of the first hole 71.

Figure 6:
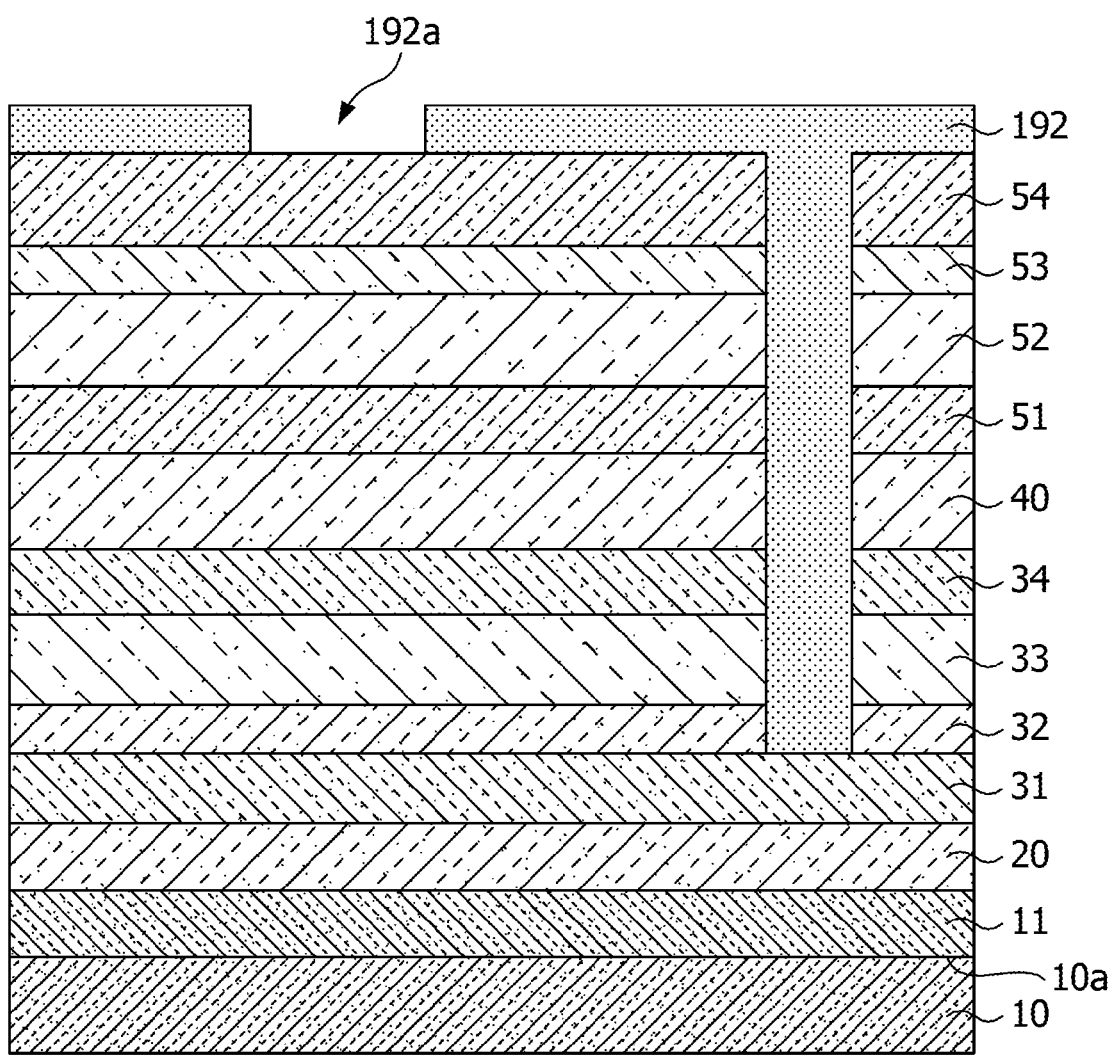
FIG. 6 is a process diagram (4) of the manufacturing method of the infrared detection device in the first embodiment.

As illustrated in FIG. 6, after the resist pattern 191 is removed, a resist pattern 192 that has an opening 192a is next formed on the fourth contact layer 54 and so forth. Specifically, after the resist pattern 191 is removed by an organic solvent or the like, the fourth contact layer 54 and so forth are coated with a photoresist, exposure by an exposure apparatus and development are performed, and the resist pattern 192 that has the opening 192a is thereby formed, for example. The thickness of the formed resist pattern 192 is approximately 1 µm, and the diameter of the opening 192a is approximately 20 µm.

Figure 7:
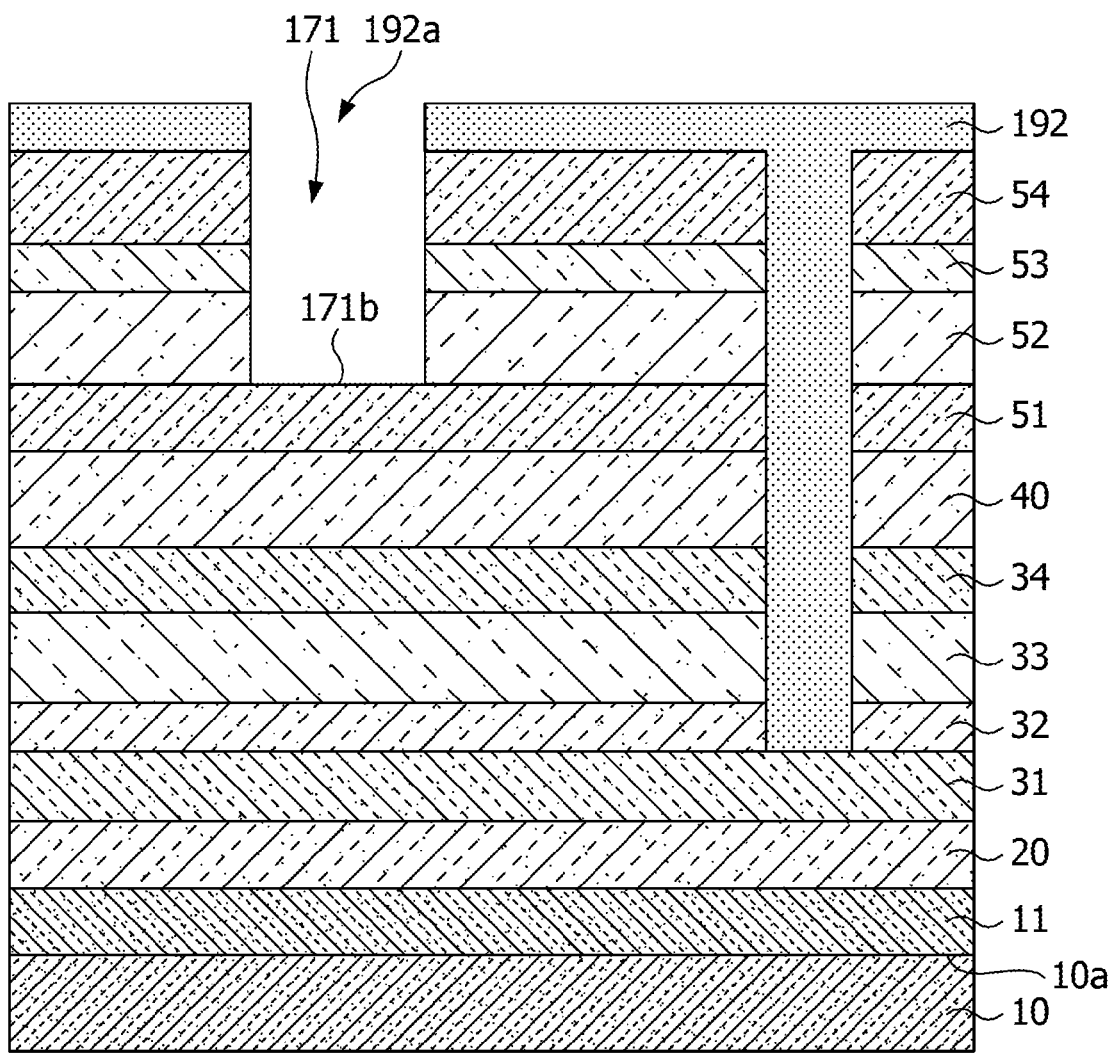
FIG. 7 is a process diagram (5) of the manufacturing method of the infrared detection device in the first embodiment.

As illustrated in FIG. 7, the compound semiconductor film in the opening 192a of the resist pattern 192 is next removed by dry etching such as RIE, and the wide width region 171 of the second hole 170 is thereby formed. Specifically, the fourth contact layer 54, the second barrier layer 53, and the second infrared absorption layer 52 in the opening 192a are removed, and the wide width region 171 of the second hole 170 is thereby formed, for example. The diameter of the wide width region 171 of the second hole 170 formed in such a manner is approximately 20 µm, and the third contact layer 51 is exposed on the bottom surface 171b of the wide width region 171.

Figure 8:
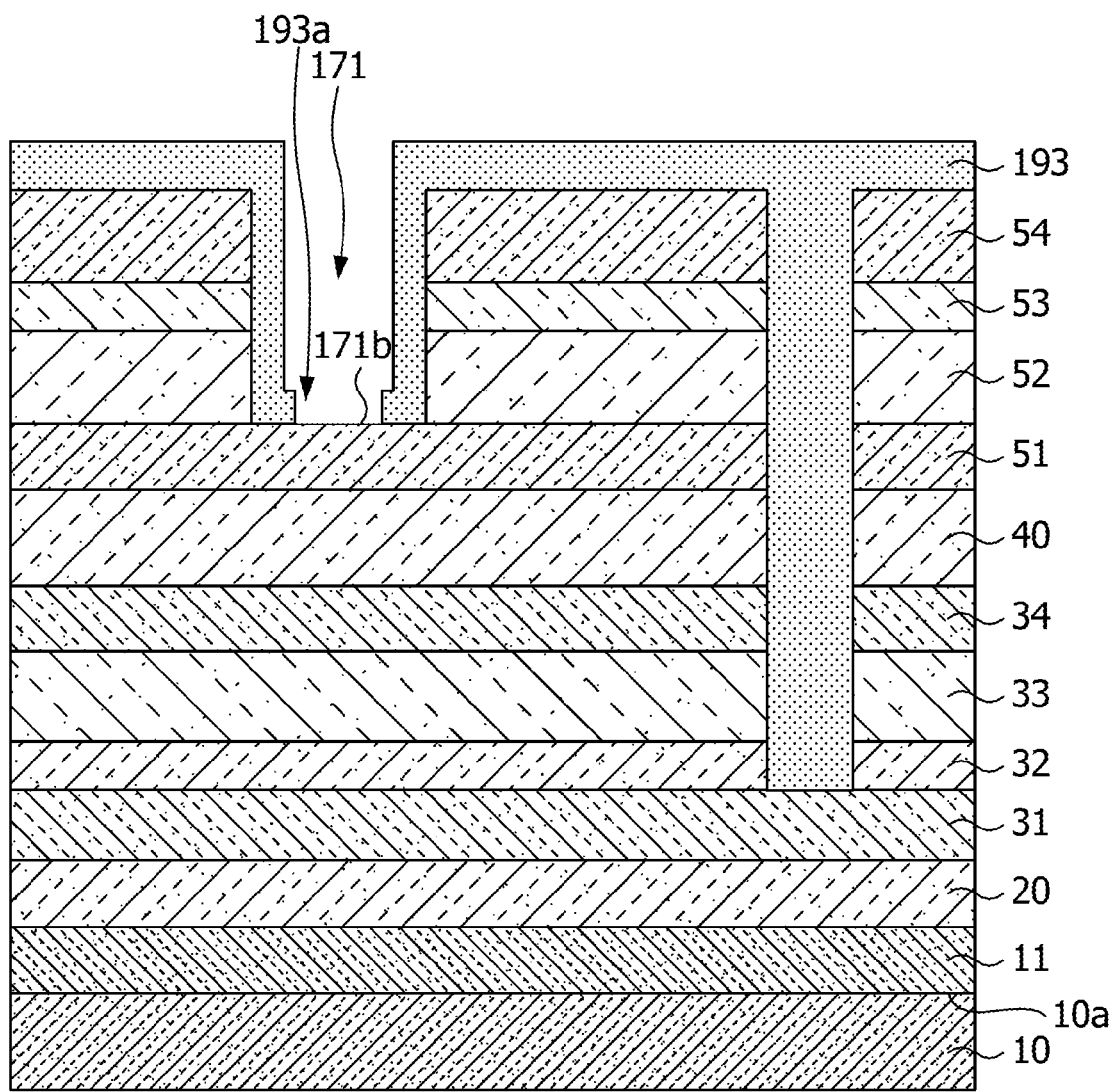
FIG. 8 is a process diagram (6) of the manufacturing method of the infrared detection device in the first embodiment.

As illustrated in FIG. 8, after the resist pattern 192 is removed, a resist pattern 193 is next formed on the third contact layer 51, the fourth contact layer 54, and so forth. Specifically, after the resist pattern 192 is removed by an organic solvent or the like, the third contact layer 51, the fourth contact layer 54, and so forth are coated with a photoresist, and exposure by an exposure apparatus and development are performed, for example. Accordingly, the resist pattern 193 is formed which has an opening 193a on the third contact layer 51 of the bottom surface 171b of the wide width region 171 of the second hole 170. The thickness of the formed resist pattern 193 is approximately 1 µm, and the diameter of the opening 193a is approximately 10 µm.

Figure 9:
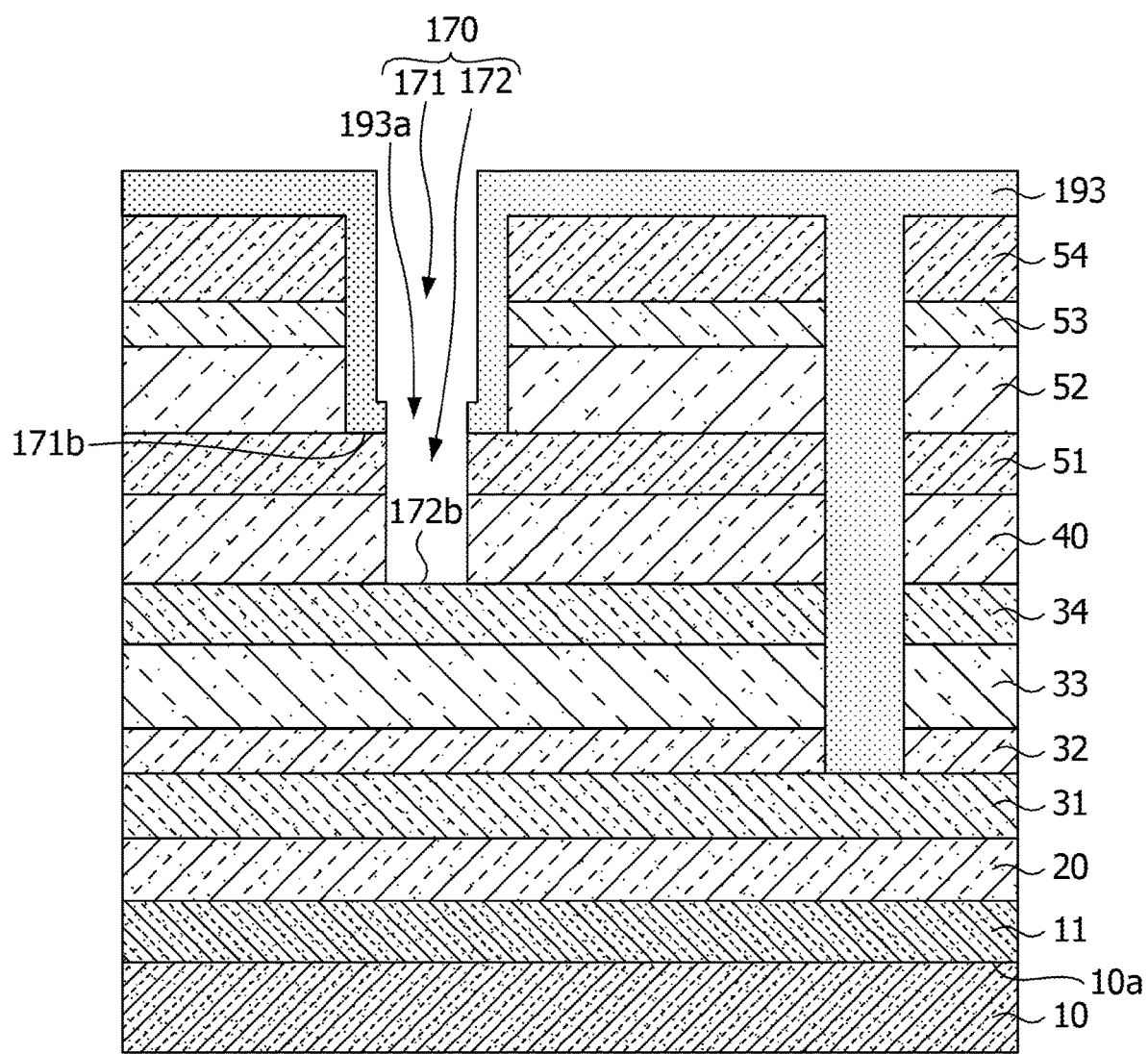
FIG. 9 is a process diagram (7) of the manufacturing method of the infrared detection device in the first embodiment.

As illustrated in FIG. 9, the compound semiconductor film in the opening 193a of the resist pattern 193 is next removed by dry etching such as RIE, and the narrow width region 172 of the second hole 170 is thereby formed. Specifically, the third contact layer 51 and the second metamorphic buffer layer 40 in the opening 193a are removed, and the narrow width region 172 of the second hole 170 is thereby formed, for example. The diameter of the narrow width region 172 of the second hole 170 formed in such a manner is approximately 10 µm, and the second contact layer 34 is exposed on the bottom surface 172b of the narrow width region 172.

Figure 10:
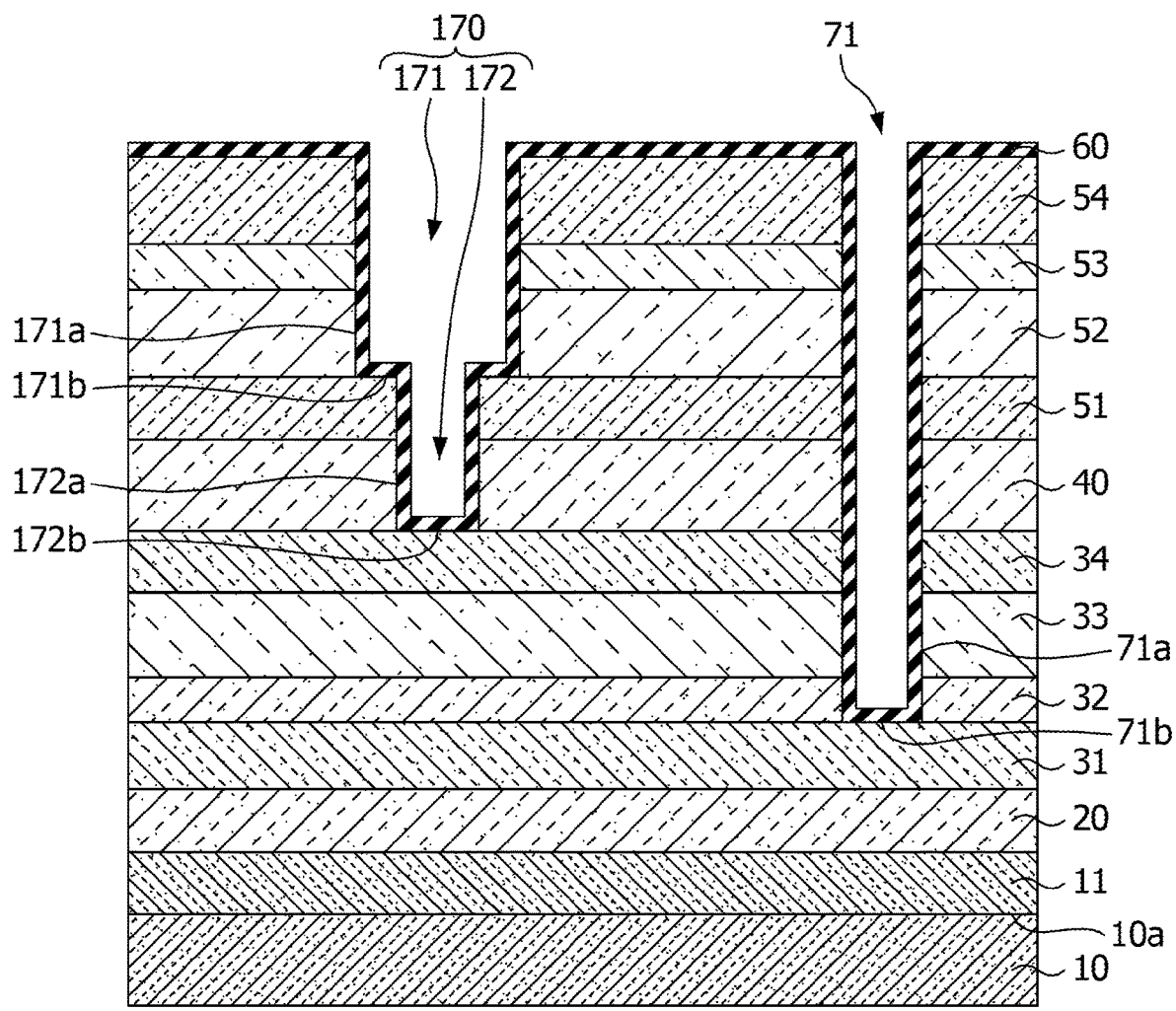
FIG. 10 is a process diagram (8) of the manufacturing method of the infrared detection device in the first embodiment.

As illustrated in FIG. 10, the resist pattern 193 is next removed, the insulating film 60 is formed in the first hole 71 and the second hole 170 and on the fourth contact layer 54. The insulating film 60 is formed by forming an SiN film with a thickness of 200 nm by plasma CVD. Accordingly, the insulating film 60 is formed on the side surface 71a and the bottom surface 71b of the first hole 71, on the side surface 171a and the bottom surface 171b of the wide width region 171 of the second hole 170, on the side surface 172a and the bottom surface 172b of the narrow width region 172, and on the fourth contact layer 54.

Figure 11:
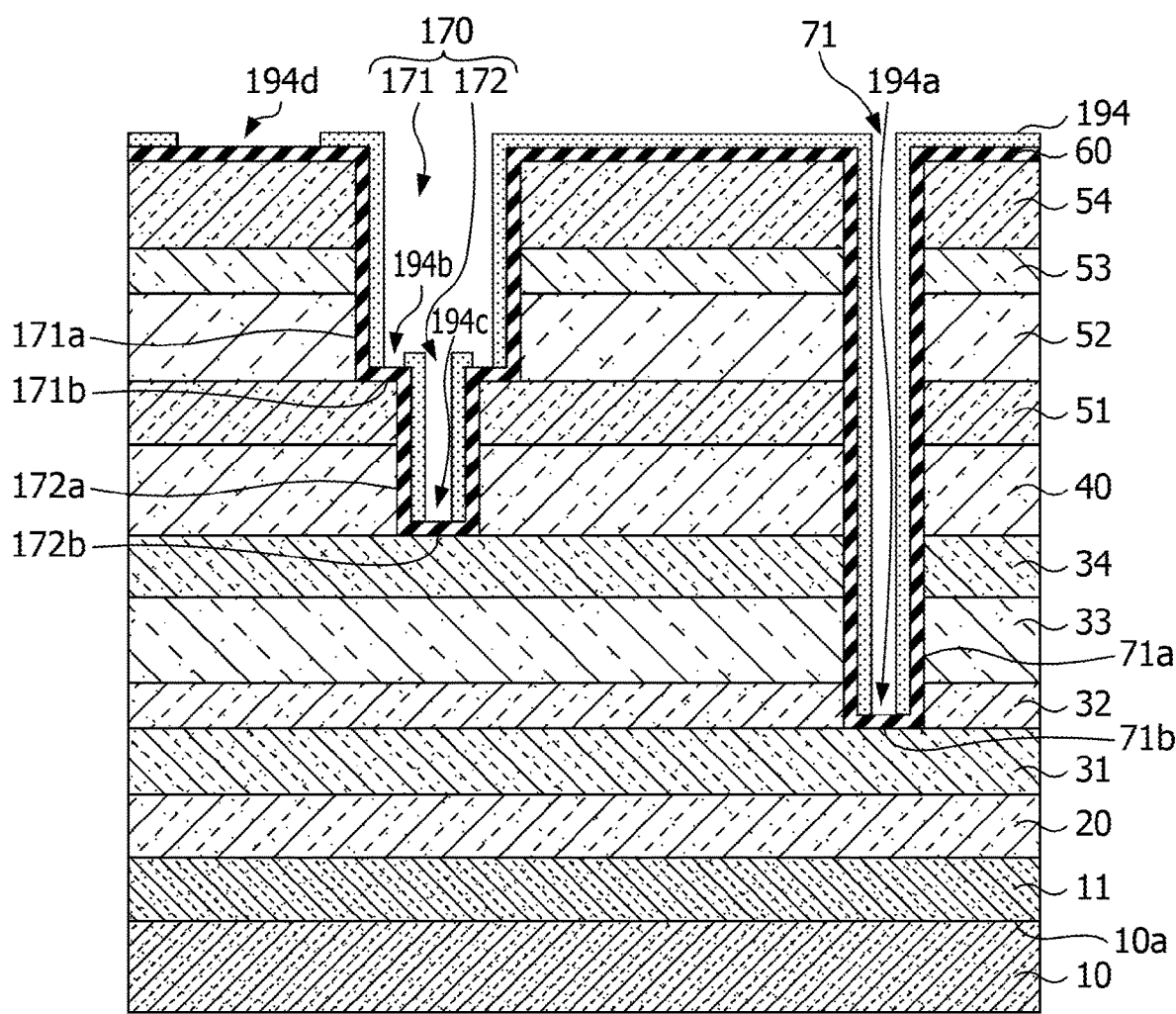
FIG. 11 is a process diagram (9) of the manufacturing method of the infrared detection device in the first embodiment.

As illustrated in FIG. 11, a resist pattern 194 that has openings 194a, 194b, 194c, and 194d is next formed on the insulating film 60. Specifically, the insulating film 60 is coated with a photoresist, and exposure by an exposure apparatus and development are performed, for example. Accordingly, the resist pattern 194 is formed which has the openings 194a, 194b, 194c, and 194d on the insulating film 60 of the bottom surface 71b of the first hole 71, the bottom surface 171b of the wide width region 171 of the second hole 170, the bottom surface 172b of the narrow width region 172, and the fourth contact layer 54.

Figure 12:
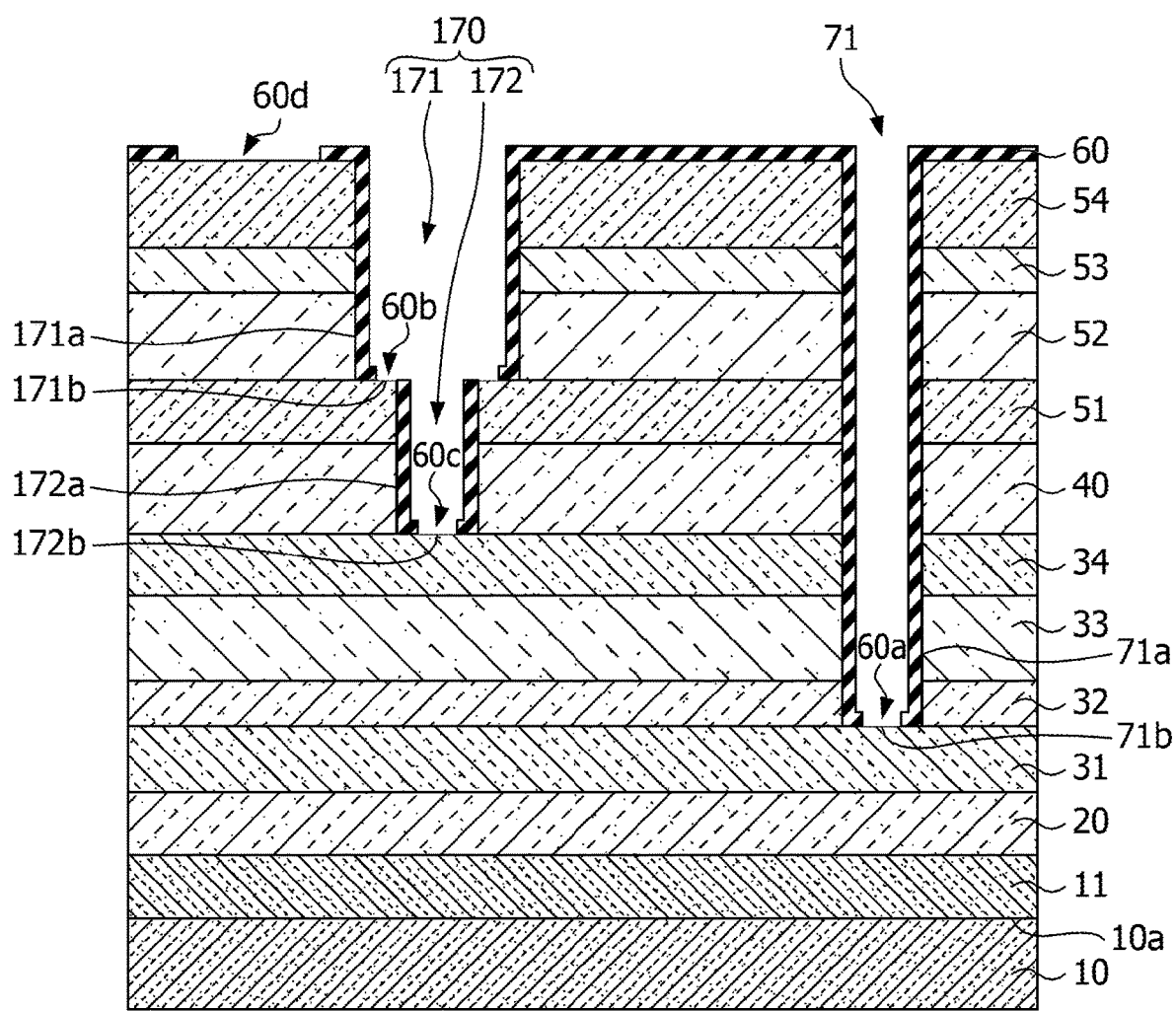
FIG. 12 is a process diagram (10) of the manufacturing method of the infrared detection device in the first embodiment.

As illustrated in FIG. 12, the insulating film 60 in the openings 194a, 194b, 194c, and 194d of the resist pattern 194 is next removed, and openings 60a, 60b, 60c, and 60d are thereby formed in the insulating film 60. Removal of the insulating film 60 is performed by dry etching such as RIE or wet etching by BHF. Accordingly, the opening 60a is formed in the insulating film 60, and the first contact layer 31 is thereby exposed on the bottom surface 71b of the first hole 71. The opening 60b is formed, and the third contact layer 51 is thereby exposed on the bottom surface 171b of the wide width region 171 of the second hole 170. The opening 60c is formed, and the second contact layer 34 is thereby exposed on the bottom surface 172b of the narrow width region 172 of the second hole 170. The opening 60d is formed, and the fourth contact layer 54 is thereby exposed.

Figure 13:
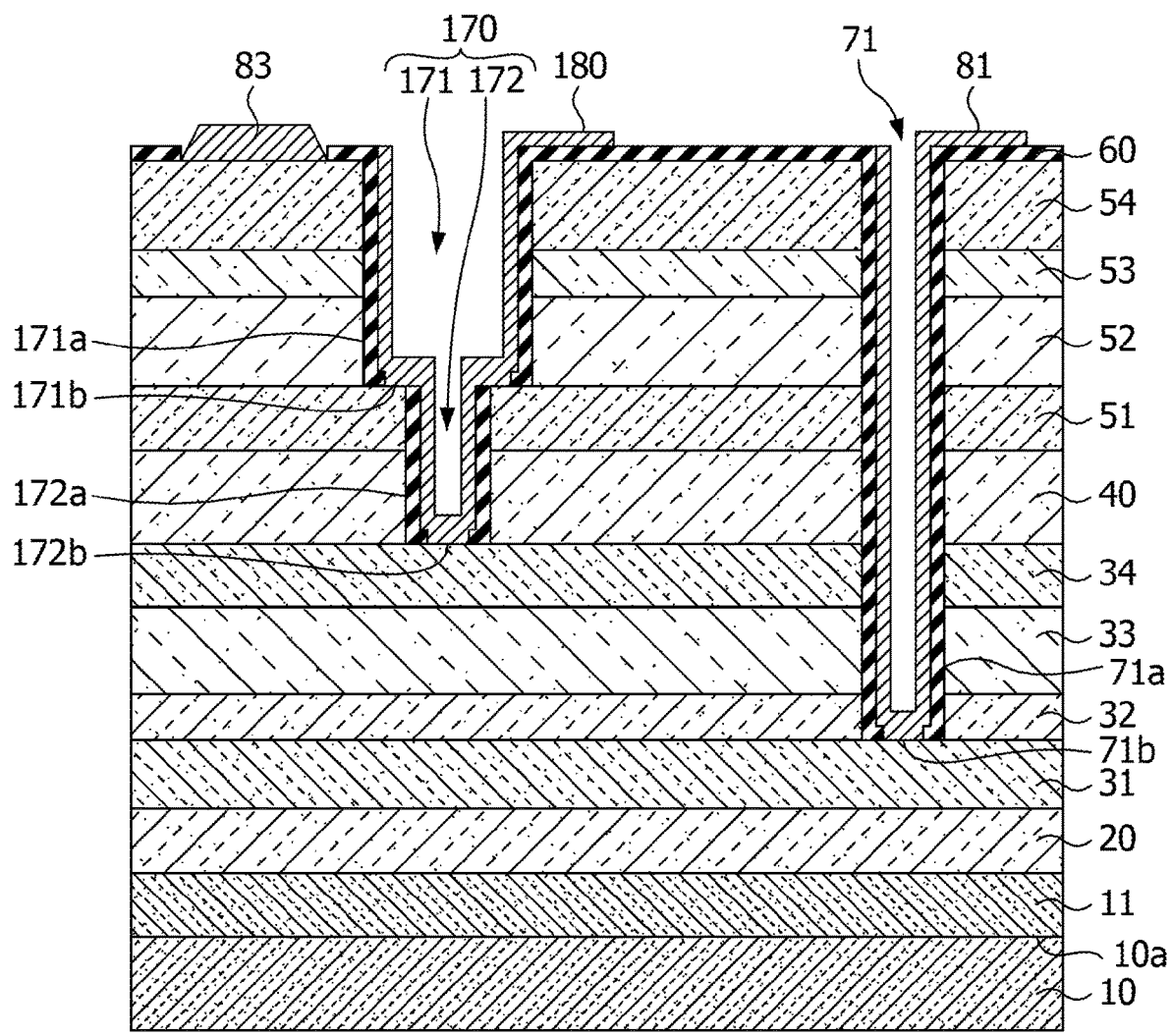
FIG. 13 is a process diagram (11) of the manufacturing method of the infrared detection device in the first embodiment.

As illustrated in FIG. 13, the lower electrode 81, the intermediate electrode 180, and the upper electrode 83 are next formed. Specifically, the insulating film 60 and the exposed contact layers are coated with a photoresist, exposure by an exposure apparatus and development are performed, and a resist pattern not illustrated is thereby formed which has openings in regions where the lower electrode 81, the intermediate electrode 180, and the upper electrode 83 are formed, for example. Subsequently, a gold (Au) film with a thickness of 1 μm is formed by vacuum deposition and is thereafter immersed in an organic solvent or the like, and the gold film on the resist pattern and the resist pattern are thereby removed together. Accordingly, the lower electrode 81, the intermediate electrode 180, and the upper electrode 83 are formed with the remaining gold film.

The lower electrode 81 is formed in the first hole 71 and is formed on the first contact layer 31 of the bottom surface 71b of the first hole 71, on the insulating film 60 of the side surface 71a of the first hole 71, and on the insulating film 60 of the fourth contact layer 54 in the vicinity of the first hole 71.

The intermediate electrode 180 is formed in the second hole 170 and is formed on the third contact layer 51 of the bottom surface 171b of the wide width region 171 of the second hole 170 and on the second contact layer 34 of the bottom surface 172b of the narrow width region 172. The intermediate electrode 180 is formed on the insulating film 60 of the side surface 171a of the wide width region 171, on the insulating film 60 of the side surface 172a of the narrow width region 172, and on the insulating film 60 of the fourth contact layer 54 in the vicinity of the second hole 170.

The upper electrode 83 is formed on the fourth contact layer 54.

The lower electrode 81 formed in such a manner is connected with the first contact layer 31, the intermediate electrode 180 is connected with the second contact layer 34 and the third contact layer 51, and the upper electrode 83 is connected with the fourth contact layer 54.

The infrared detection device in this embodiment may be fabricated by the above method. FIG. 2 and FIG. 13 illustrate the portion that corresponds to one pixel of the infrared detection device in this embodiment. However, in the infrared detection device in this embodiment, 256×256 pixels are formed two-dimensionally. The size of one pixel is approximately 50 μm×50 μm, for example. Because pixel separating grooves for separating pixels are formed, the size of the whole infrared detection device is 15.36 mm×15.36 mm.

(Infrared Detection Apparatus)

Figure 14:
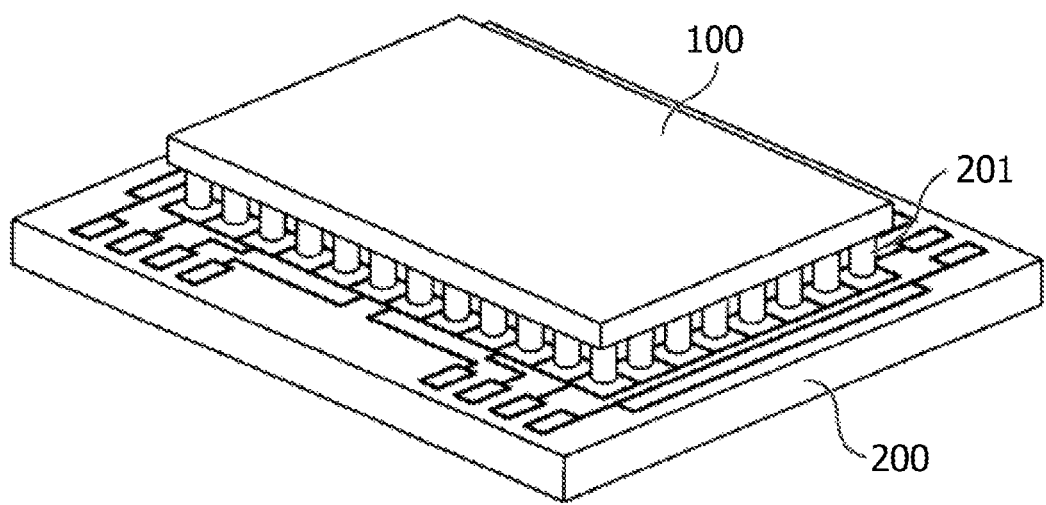
FIG. 14 is a perspective diagram of an infrared detection apparatus in the first embodiment.

As illustrated in FIG. 14, in an infrared detection apparatus in this embodiment, a signal read-out circuit element 200 is connected with an infrared detection device 100. Specifically, a signal read-out circuit is formed on a surface of the signal read-out circuit element 200, and electrodes of the signal read-out circuit of the signal read-out circuit element 200 are connected with corresponding electrodes in the infrared detection device 100 by bumps 201, for example.

[Second Embodiment]

Figure 15:
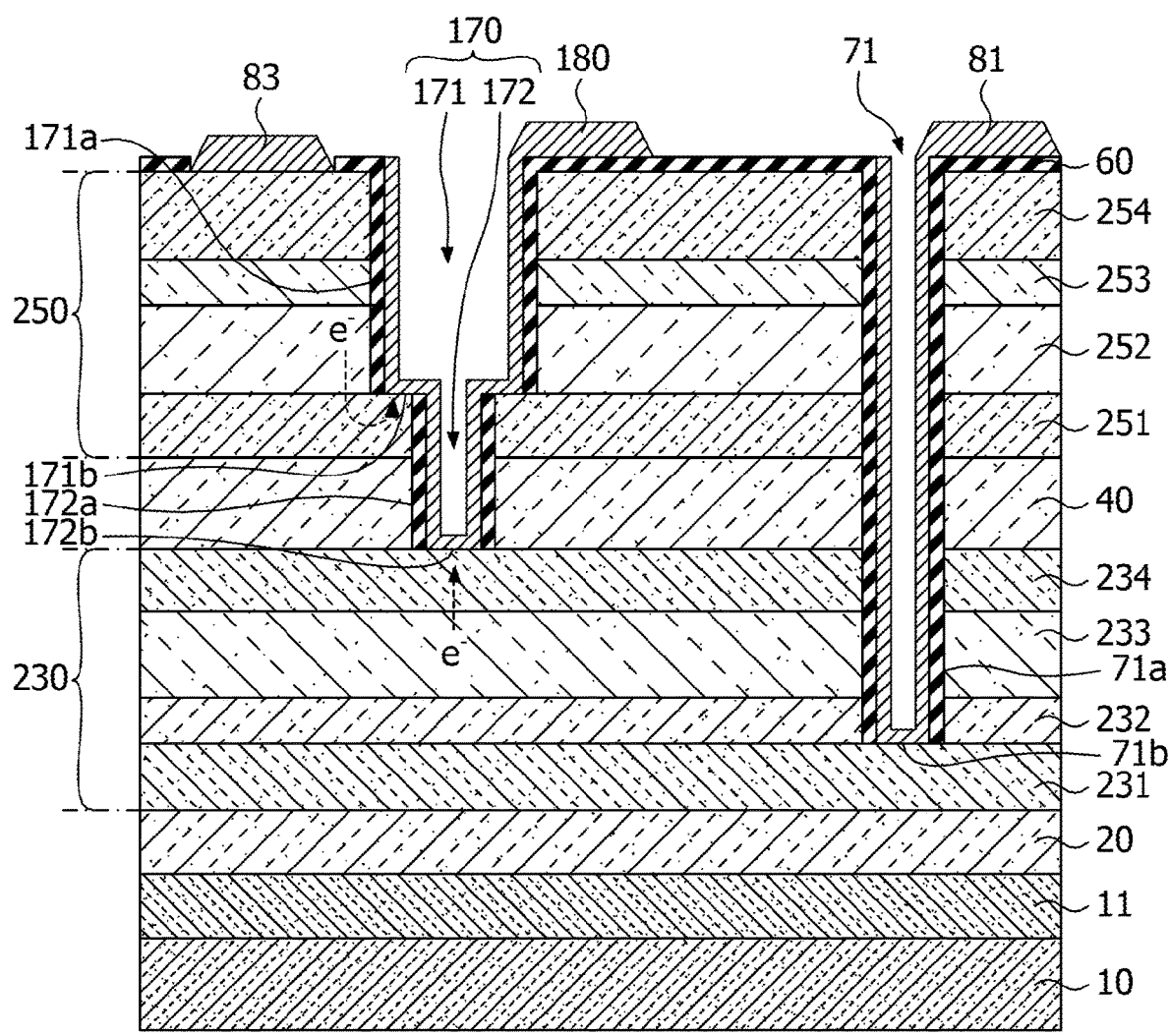
FIG. 15 is a structural diagram of an infrared detection device in a second embodiment.

A description will next be made about a two-wavelength type infrared detection device as an infrared detection device in a second embodiment based on FIG. 15.

In the infrared detection device in this embodiment, the buffer layer 11, the first metamorphic buffer layer 20, a first contact layer 231, a first barrier layer 232, a first infrared absorption layer 233, a second contact layer 234, the second metamorphic buffer layer 40, a third contact layer 251, a second infrared absorption layer 252, a second barrier layer 253, and a fourth contact layer 254 are laminated on the GaSb substrate 10.

In this embodiment, a first infrared absorption unit 230 is formed with the first contact layer 231, the first barrier layer 232, the first infrared absorption layer 233, and the second contact layer 234. A second infrared absorption unit 250 is formed with the third contact layer 251, the second infrared absorption layer 252, the second barrier layer 253, and the fourth contact layer 254. Consequently, in the two-wavelength type infrared detection device in this embodiment, the buffer layer 11, the first metamorphic buffer layer 20, the first infrared absorption unit 230, the second metamorphic buffer layer 40, and the second infrared absorption unit 250 are laminated on the GaSb substrate 10.

The first metamorphic buffer layer 20 is formed with i-AlSb with a thickness of approximately 2000 nm. The first contact layer 231 is formed with $p^+$-$InAs_{0.8}Sb_{0.2}$ with a thickness of approximately 500 nm, and the first barrier layer 232 is formed with p-AlSb with a thickness of approximately 200 nm. The first infrared absorption layer 233 is formed with $p$-$InAs_{0.8}Sb_{0.2}$ with a thickness of approximately 1000 nm, and the second contact layer 234 is formed with $p^+$-$InAs_{0.8}Sb_{0.2}$ with a thickness of approximately 500 nm. The second metamorphic buffer layer 40 is formed with i-InAlSb with a thickness of approximately 2000 nm. The third contact layer 251 is formed with $p^+$-$InAs_{0.54}Sb_{0.46}$ with a thickness of approximately 500 nm, and the second infrared absorption layer 252 is formed with $p$-$InAs_{0.54}Sb_{0.46}$ with a thickness of approximately 1000 nm. The second barrier layer 253 is formed with $p$-$In_{0.25}Al_{0.75}Sb$ with a thickness of approximately 200 nm, and the fourth contact layer 54 is formed with $p^+$-$InAs_{0.54}Sb_{0.46}$ with a thickness of approximately 500 nm. Consequently, in the infrared detection device in this embodiment, the first contact layer 231, the second contact layer 234, the third contact layer 251, and the fourth contact layer 254 are p-type.

The fourth contact layer 254, the second barrier layer 253, the second infrared absorption layer 252, the third contact layer 251, the second metamorphic buffer layer 40, the second contact layer 234, the first infrared absorption layer 233, and the first barrier layer 232 are removed, and the first hole 71 is thereby formed. The insulating film 60 is formed on the side surface 71a of the first hole 71 and the fourth contact layer 254. However, the insulating film 60 is not formed on the first contact layer 231 of the bottom surface 71b of the first hole 71.

The second hole 170 is formed with the wide width region 171 on the inlet side and the narrow width region 172 with a small diameter in a deeper position than the wide width region 171. The wide width region 171 of the second hole 170 is formed by removing the fourth contact layer 254, the second barrier layer 253, and the second infrared absorption layer 252. The narrow width region 172 is formed by further removing the third contact layer 251 and the second metamorphic buffer layer 40. The side surface 171a of the wide width region 171 and the side surface 172a of the narrow width region 172 are covered by the insulating film 60. The insulating film 60 is not formed on the third contact layer 251 of the bottom surface 171b of the wide width region 171, which become the step portion of the second hole 170, or on the second contact layer 234 of the bottom surface 172b of the narrow width region 172.

The lower electrode 81 is formed on the first contact layer 231 of the bottom surface 71b of the first hole 71, on the insulating film 60 of the side surface 71a of the first hole 71, and on the insulating film 60 in the vicinity of the first hole 71.

The intermediate electrode 180 is formed on the insulating film 60 of the side surfaces 171a and 172a of the second hole 170, on the insulating film 60 in the vicinity of the second hole 170, on the third contact layer 251 of the bottom surface 171b of the wide width region 171, and on the second contact layer 234 of the bottom surface 172b of the narrow width region 172. Consequently, in the second hole 170, the third contact layer 251 and the second contact layer 234 are connected together by the intermediate electrode 180.

The insulating film 60 on the fourth contact layer 254 is partially removed, and the upper electrode 83 is formed on the fourth contact layer 254 from which the insulating film 60 is removed.

In the two-wavelength type infrared detection device in this embodiment, the first infrared absorption layer 233 and the second infrared absorption layer 252 are formed not with a multiple quantum structure but with InAsSb bulk mixed crystals.

Infrared rays of the middle infrared wavelength band among incident infrared rays are absorbed by the first infrared absorption layer 233, and electrons as photo carriers are produced. The electrons produced in the first infrared absorption layer 233 flow to the intermediate electrode 180 via the second contact layer 234. The electrons that flow to the intermediate electrode 180 are measured, and the light amount of the infrared rays of the middle infrared wavelength band, which are absorbed by the first infrared absorption layer 233, may thereby be measured.

Infrared rays of the far infrared wavelength band among the incident infrared rays are transmitted through the first infrared absorption layer 233 with a wide band gap and are absorbed by the second infrared absorption layer 252, and electrons as photo carriers are produced. The electrons produced in the second infrared absorption layer 252 flow to the intermediate electrode 180 via the third contact layer 251. The electrons that flow to the intermediate electrode 180 are measured, and the light amount of the infrared rays of the far infrared wavelength band, which are absorbed by the second infrared absorption layer 252, may thereby be measured.

That is, in the infrared detection device in this embodiment, both of the electrons produced in the first infrared absorption layer 233 and the electrons produced in the second infrared absorption layer 252 reach the intermediate electrode 180 without passing through the second metamorphic buffer layer 40, for example. That is, both of the electrons produced in the first infrared absorption layer 233 and the electrons produced in the second infrared absorption layer 252 reach the intermediate electrode 180 without passing through the second metamorphic buffer layer 40 that includes many crystal defects such as lattice defects, for example. Thus, the electrons produced in the first infrared absorption layer 233 and the electrons produced in the second infrared absorption layer 252 flow to the intermediate electrode 180 without being decreased. Accordingly, the light amount of the infrared rays absorbed by the first infrared absorption layer 233 and the light amount of the infrared rays absorbed by the second infrared absorption layer 252 may accurately be measured without being decreased.

The other contents than the above are similar to the first embodiment.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An infrared detection device comprising:
    a semiconductor crystal substrate;
    a first metamorphic buffer layer that is formed on the semiconductor crystal substrate;
    a first contact layer that is formed on the first metamorphic buffer layer;
    a first infrared absorption layer that is formed on the first contact layer;
    a second contact layer that is formed on the first infrared absorption layer;
    a second metamorphic buffer layer that is formed on the second contact layer;
    a third contact layer that is formed on the second metamorphic buffer layer;
    a second infrared absorption layer that is formed on the third contact layer;
    a fourth contact layer that is formed on the second infrared absorption layer;
    a lower electrode that is connected with the first contact layer;
    an upper electrode that is connected with the fourth contact layer; and
    an intermediate electrode that is connected with the second contact layer and the third contact layer.

2. The infrared detection device according to claim 1, wherein
    the first contact layer, the second contact layer, the third contact layer, and the fourth contact layer are doped with an impurity element that makes the first contact layer, the second contact layer, the third contact layer, and the fourth contact layer become n-type.

3. The infrared detection device according to claim 1, wherein
    the first contact layer, the second contact layer, the third contact layer, and the fourth contact layer are doped with an impurity element that makes the first contact layer, the second contact layer, the third contact layer, and the fourth contact layer become p-type.

4. The infrared detection device according to claim 1, further comprising:
    a first hole that is formed by removing the fourth contact layer, the second infrared absorption layer, the third contact layer, the second metamorphic buffer layer, the second contact layer, and the first infrared absorption layer; and
    a second hole that is formed by removing the fourth contact layer, the second infrared absorption layer, the third contact layer, and the second metamorphic buffer layer, wherein
    an insulating film is formed on a side surface of the first hole and a side surface of the second hole,
    the lower electrode is formed on the first contact layer of a bottom surface of the first hole and on the insulating film of the side surface of the first hole,
    the second hole includes a wide width region that is formed by removing the fourth contact layer and the second infrared absorption layer and a narrow width region that is narrower than the wide width region and is formed by removing the third contact layer of a bottom surface of the wide width region and the second metamorphic buffer layer, and the intermediate electrode is formed on the second contact layer of a bottom surface of the second hole, on the third contact layer of a bottom surface of the second hole, and on the insulating film of the side surface of the second hole.

5. The infrared detection device according to claim 1, wherein the first contact layer, the first infrared absorption layer, and the second contact layer are formed of $InAs_XSb_{1-X}$ and X is set such that $0.8 \leq X \leq 1.0$, and the third contact layer, the second infrared absorption layer, and the fourth contact layer are formed of $InAs_YSb_{1-Y}$ and Y is set such that $0 \leq Y < 0.8$.

6. The infrared detection device according to claim 1, wherein a lattice constant of the second infrared absorption layer and a lattice constant of the first infrared absorption layer satisfy $0.1\% \leq$ (the lattice constant of the second infrared absorption layer–the lattice constant of the first infrared absorption layer)/(the lattice constant of the first infrared absorption layer)$\leq 6.97\%$.

7. The infrared detection device according to claim 1, wherein a first barrier layer is formed between the first contact layer and the first infrared absorption layer, and a second barrier layer is formed between the second infrared absorption layer and the fourth contact layer.

8. The infrared detection device according to claim 7, wherein the first barrier layer is formed of AlSb, and
the second barrier layer is formed of InAlSb.

9. The infrared detection device according to claim 1, wherein a thickness of the second metamorphic buffer layer is 1000 nm or greater.

10. An infrared detection apparatus comprising:
an infrared detection device that includes:
a semiconductor crystal substrate,
a first metamorphic buffer layer that is formed on the semiconductor crystal substrate,
a first contact layer that is formed on the first metamorphic buffer layer,
a first infrared absorption layer that is formed on the first contact layer,
a second contact layer that is formed on the first infrared absorption layer,
a second metamorphic buffer layer that is formed on the second contact layer,
a third contact layer that is formed on the second metamorphic buffer layer,
a second infrared absorption layer that is formed on the third contact layer,
a fourth contact layer that is formed on the second infrared absorption layer,
a lower electrode that is connected with the first contact layer,
an upper electrode that is connected with the fourth contact layer, and
an intermediate electrode that is connected with the second contact layer and the third contact layer; and
a signal read-out circuit element that is connected with the infrared detection device.

11. The infrared detection apparatus according to claim 10, wherein the first contact layer, the second contact layer, the third contact layer, and the fourth contact layer are doped with an impurity element that makes the first contact layer, the second contact layer, the third contact layer, and the fourth contact layer become n-type.

12. The infrared detection apparatus according to claim 10, wherein the first contact layer, the second contact layer, the third contact layer, and the fourth contact layer are doped with an impurity element that makes the first contact layer, the second contact layer, the third contact layer, and the fourth contact layer become p-type.

13. The infrared detection apparatus according to claim 10, further comprising:

a first hole that is formed by removing the fourth contact layer, the second infrared absorption layer, the third contact layer, the second metamorphic buffer layer, the second contact layer, and the first infrared absorption layer; and a second hole that is formed by removing the fourth contact layer, the second infrared absorption layer, the third contact layer, and the second metamorphic buffer layer, wherein an insulating film is formed on a side surface of the first hole and a side surface of the second hole, the lower electrode is formed on the first contact layer of a bottom surface of the first hole and on the insulating film of the side surface of the first hole, the second hole includes a wide width region that is formed by removing the fourth contact layer and the second infrared absorption layer and a narrow width region that is narrower than the wide width region and is formed by removing the third contact layer of a bottom surface of the wide width region and the second metamorphic buffer layer, and the intermediate electrode is formed on the second contact layer of a bottom surface of the second hole, on the third contact layer of a bottom surface of the second hole, and on the insulating film of the side surface of the second hole.

14. A manufacturing method of an infrared detection device, the manufacturing method comprising:

laminating, sequentially, a first metamorphic buffer layer, a first contact layer, a first infrared absorption layer, a second contact layer, a second metamorphic buffer layer, a third contact layer, a second infrared absorption layer, and a fourth contact layer on a semiconductor crystal substrate;

forming a first hole, in which the first contact layer is exposed on a bottom surface, by removing the fourth contact layer, the second infrared absorption layer, the third contact layer, the second metamorphic buffer layer, the second contact layer, and the first infrared absorption layer;

forming a wide width region of a second hole, in which the third contact layer is exposed on a bottom surface, by removing the fourth contact layer and the second infrared absorption layer;

forming a narrow width region of the second hole, in which the second contact layer is exposed on a bottom surface, by removing the third contact layer and the second metamorphic buffer layer in the bottom surface of the wide width region;

forming an insulating film on side surfaces of the first hole and the second hole; and forming a lower electrode that is connected with the first contact layer in the first hole, an intermediate electrode that is connected with the third contact layer and the second contact layer in the second hole, and an upper electrode on the fourth contact layer.

* * * * *